United States Patent [19]

Tatami

[11] Patent Number: 4,679,005
[45] Date of Patent: Jul. 7, 1987

[54] PHASE LOCKED LOOP WITH FREQUENCY OFFSET

[75] Inventor: Mitsushige Tatami, Kanagawa, Japan

[73] Assignee: Sony Corporation, Tokyo, Japan

[21] Appl. No.: 819,850

[22] Filed: Jan. 17, 1986

[30] Foreign Application Priority Data

Jan. 23, 1985 [JP] Japan ................... 60/009263
Feb. 13, 1985 [JP] Japan ................... 60/009267

[51] Int. Cl.$^4$ ............................................. H03L 7/18
[52] U.S. Cl. ........................................ 331/16; 331/20; 331/23; 331/25; 358/17; 358/158
[58] Field of Search ............ 331/16, 20, 23, 25; 358/17-20, 24, 25, 158, 159

[56] References Cited

U.S. PATENT DOCUMENTS 4,009,450  2/1977  Holcomb et al. ............... 331/25 X
4,023,115  5/1977  Nicolas ........................... 331/25 X Primary Examiner—Siegfried H. Grimm
Attorney, Agent, or Firm—Lewis H. Eslinger; Alvin Sinderbrand

[57] ABSTRACT

A phase-locked loop for generating an output signal whose phase is locked onto that of a reference signal and whose frequency is offset in respect to an integral multiple of the reference signal frequency comprises a variable-frequency oscillator the output frequency of which is adapted to be varied according to an error signal output from a phase comparator. A frequency divider divides the output frequency from the variable-frequency oscillator by a predetermined dividing ratio, and a phase modulator is supplied with the output of the frequency divider and controlled so that its phase shift amount is increased with time. The output of the phase modulator is compared, in the phase comparator, with the reference signal, the dividing ratio of the frequency divider is changed at intervals related to the offset frequency, and the phase shift amount of the phase modulator is reset at the same time.

7 Claims, 10 Drawing Figures

PHASE LOCKED LOOP WITH FREQUENCY OFFSET

BACKGROUND OF THE INVENTION

1. Field of the Invention

The present invention relates to a phase locked loop and more particularly to a phase locked loop which is suitable for the case where the ratio between the input signal and output signal is not a simple integer.

2. Description of the Prior Art

A phase locked loop (PLL) is generally formed of a phase comparator 1, low-pass filter 2, voltage-controlled oscillator 3, and a frequency dividing circuit 4 as shown in FIG. 10, and the output $f_o$ is synchronized with the input frequency $f_r$ in the relationship $$f_o = N f_r,$$

where N is the dividing ratio of the frequency dividing circuit 4.

However, is a TBC (Time Base error Corrector) for removing the jitter along time axis of a regenerated video signal, a phase locked loop in which the ratio between the input frequency and output frequency is not a simple integer is required for restoration of the interleave of the luminance signal and color signal.

The foregoing results from the fact that the color subcarrier frequency $f_{sc}$ in the PAL system is set up such that:

$$f_{sc} = (1135/4) f_H + (\tfrac{1}{2}) f_V,$$

where
 $f_H$ = horizontal scanning frequency and
 $f_V$ = vertical scanning frequency.
Since the offset frequency $(\tfrac{1}{2}) f_V$ is added as above, in the case where the color subcarrier frequency $f_{sc}$ is formed with the horizontal scanning frequency $f_H$ taken as the reference signal, the color subcarrier frequency for the PAL system cannot be formed by the phase locked loop shown in FIG. 10.

SUMMARY OF THE INVENTION

It is a primary object of the present invention to provide a phase locked loop which will overcome the difficulty encountered in the prior art.

Another object of the invention is to provide a phase locked loop which will produce the output in synchronism with the input signal even if the ratio between the input frequency and output frequency is not a simple integer, that is, for example, in the case where $f_0 = N f_r + \Delta f$.

A further object of the invention is to provide a phase locked loop which, in a processing circuit for processing a composite color television signal of the PAL system, will generate a color subcarrier frequency in synchronism with the horizontal synchronizing signal.

To achieve the above mentioned objects, the present invention employs a phase modulator whose phase shift amount varies substantially linearly with the lapse of time, such phase modulator being inserted in the control loop of a phase locked loop including a voltage-controller oscillator which is phase-locked to the input frequency $f_r$ as the reference signal, so that a small frequency variance is provided as the offset frequency between the input frequency and output frequency.

According to the present invention, since the phase modulator whose phase shift amount varies linearly and the dividing ratio of the frequency dividing circuit in the phase locked loop are controlled periodically at intervals determined by the offset frequency, the phase locked loop can generate an output frequency that will be the sum of the input frequency or an integral multiple thereof and a small offset frequency.

DESCRIPTION OF THE PREFERRED EMBODIMENT

Figure 1:
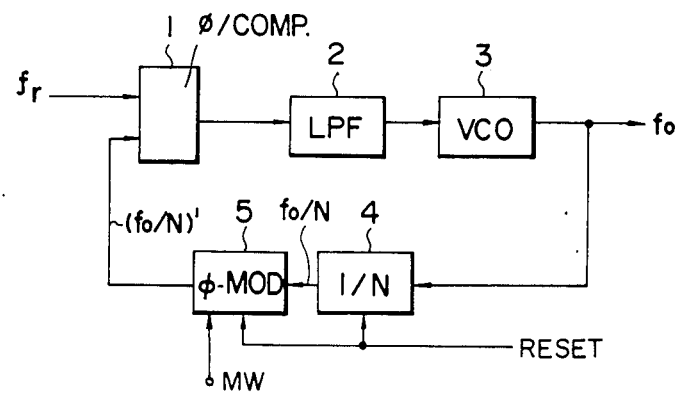
FIG. 1 is a block diagram showing the principle of a phase locked loop according to the present invention.
Figure 10:
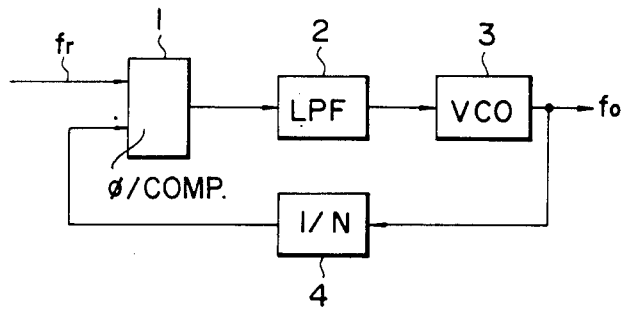
FIG. 10 is a block diagram showing a prior art phase locked loop.

FIG. 1 is a block diagram showing a phase locked loop (hereafter to be referred to as a PLL circuit) according to one embodiment of the invention, wherein, as in FIG. 10, 1 denotes a phase comparator, 2 denotes a low-pass filter, 3 denotes a voltage-controlled oscillator, and 4 denotes a frequency dividing circuit.

In accordance with the invention, there is added to the above a phase modulator 5 which performs phase modulation according to a signal MW supplied from the outside and which is adapted so that, when a ramp wave, for example, is input thereto, the phase shift amount will linearly increase with time.

Figure 2:
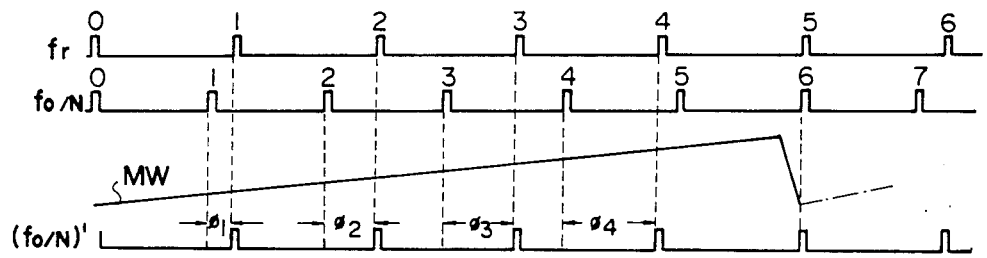
FIG. 2 is a waveform chart to which reference will be made in explaining the operation of the phase-locked loop

Accordingly, even if the divided frequency $f_o/N$ from the frequency dividing circuit 4 has the relationship $f_r < f_o/N$ with the input frequency $f_r$ as indicated in the waveforms in FIG. 2, the output of the frequency dividing circuit 4 will be phase shifted by the phase shift amounts $\phi_1, \phi_2, \phi_3$ which are increased progressively for successive periods, ... by means of the phase modulator 5 to which shift control wave MW of a sawtooth waveform is supplied, and eventually, the phases of the input frequency $f_r$ and phase shifted divided frequency ($f_o/N$), will come to coincide with each other, and the synchronism in the relationship of $f_r = f_o/N + \Delta f$ can be maintained. In other words, an offset frequency $\Delta f$ can be added.

In the above case, the shift control wave MW must linearly increase the phase shift amounts caused by the phase modulator 5 indefinitely with time and this cannot be realistically achieved. However, if the signal of the input frequency $f_r$ is after m clocks thereof brought into phase with the signal of the divided frequency $f_o/N$ at the next clock thereof as shown in FIG. 2 (which illustrates the case of m=5), then the phase modulator 5 could be reset at that point.

However, in the case where the input frequency $f_r$ and the divided frequency $f_o/N$ have a small frequency difference ($\Delta f$) therebetween, the time period to bring the signals with frequencies $f_r$ and $f_o/N$ in phase with each other, that is, the time period for m clocks, will become long. In such a case, the shift control wave MW may be reset after m clocks have elapsed and the count value in the frequency dividing circuit 4 may be changed by n clocks at that point to bring them in phase.

The above mentioned process may be described more generally in the following.

In the PLL circuit as described above, the output frequency $f_o$ of the voltage-controlled oscillator 3 receives the following phase shift amount $\phi(T)$ after the time period T:

$$\phi(T) = 2\pi \int_0^T f_o \cdot dt \quad (1)$$

$$= 2\pi(N \cdot f_r + \Delta f)T$$

The term $2\pi N \cdot f_r \cdot T$ of the above equation (1) is the phase shift amount provided by the frequency dividing circuit 4, whereas the term $2\pi \Delta f \cdot T$ is the phase shift amount provided by the phase modulator 5.

Now, if the terms of equation (1) are expressed by two integers m and n, such that:

$(N \cdot f_r + \Delta f)T = m$ $\Delta f \cdot T = n$ } (2)

then m indicates the number of clocks of the output frequency $f_o$ to be output after the time period T, that is, the number of clocks of the voltage-controlled oscillator 3 to be counted by the frequency dividing circuit 4, and n likewise indicates the phase shift amount provided by the phase modulator 5 after the lapse of time T, but converted to a number of clocks of the voltage-controlled oscillator 3.

Therefore, if the above equations (2) are applied, in the circuit of FIG. 1 it is shown that there exists the phase difference corresponding to n clocks between the input frequency $f_r$ and the divided frequency $f_o/N$ when the phase modulator 5 is reset at every m clocks. Therefore, by providing a reset signal so that the frequency dividing circuit 4 will not count the clock signal of n clocks duration, the same can be set back to an initial phase state at the next clock. Thus, the output frequency $f_o = Nf_r + \Delta f$ providing the input frequency $f_r$ with the offset frequency ($\Delta f$) can be formed by the PLL circuit.

From the above equations (2) are derived:

$m/n = (N \cdot f_r)/66 f + 1$ (3)

$\Delta f = n/(m-n) \cdot N \cdot f_r$ (4)

and therefore, if n and m are given, the offset frequency $\Delta f$ in $f_o = N \cdot f_r + \Delta f$ can be calculated, or, conversely, if the offset frequency $\Delta f$ is given, the required frequency dividing ratio N for certain integers m and n can be calculated from equation (4).

Figure 3:
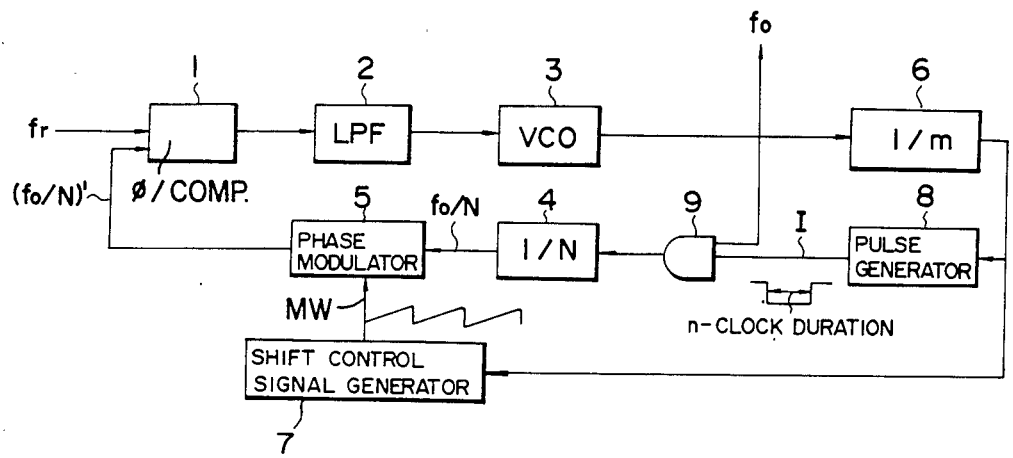
FIG. 3 is a circuit diagram showing more concretely a phase locked loop according to a first embodiment of the invention.

FIG. 3 is a block diagram specifically showing a circuit generating the output $f_o = N \cdot f_r + \Delta f$ based on the above described general equations. In FIG. 3, numeral references 1 to 5 denote parts similar to those identified by the same reference numerals in FIG. 1.

Numeral reference 6 denotes a counter for driving, upon its making m counts of the output frequency $f_o$ from the voltage-controlled oscillator 3, a pulse generator 8 constituted by a monostable multivibrator and providing a pulse of n-clock duration. Also in response to the output pulse from counter 6, a shift control signal generator 7 generating a sawtooth wave is reset, and an AND gate 9 is closed or disabled, whereby the division ratio of the frequency dividing circuit 4 is increased by the duration corresponding to n clocks.

Figure 4:
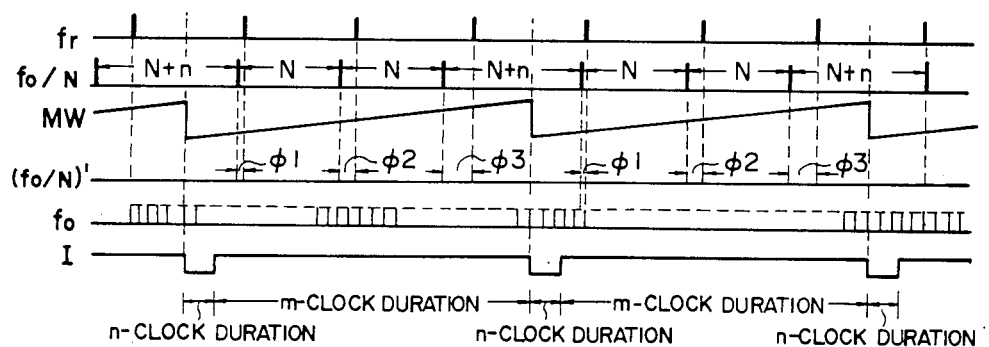
FIG. 4 is a waveform chart to which reference will be made in explaining the operation of the phase-locked loop of FIG. 3.

By the described arrangement of the PLL circuit, as shown in FIG. 4, when the predetermined count value m is reached by counter 6 in counting the number of clocks of the output frequency $f_o$ of the voltage-controlled oscillator 3, the shift control wave (sawtooth wave) MW from the shift control signal generator 7 is reset and, at the same time, the pulse generator 8 is driven to output a negative or gate disabling pulse I and by this gate disabling pulse the input clock pulses of n clock duration are blocked from being supplied to the frequency dividing circuit 4. Therefore, the frequency dividing circuit 4 is adapted to count N+n in the time period during which the count value of m is reached by counter 6.

Further, the clocks of the output $f_o/N$ of the frequency dividing circuit 4 are linearly shifted by $\phi_1 < \phi_2 < \phi_3 < \ldots$ according to the levels of the shift control wave MW which is supplied to the phase modulator 5, and thus, the output ($f_o/N$), of phase modulator 5 is made to be synchronism with the input frequency $f_r$.

Therefore, in the PLL circuit according to the invention, the difference $\Delta f$ between the input frequency $f_r$ and output frequency $f_o/N$ can be arbitrarily established by assigning certain integers m and n and it has been made possible to provide a PLL circuit which produces a synchronized condition even if the value of $\Delta f$ is very small.

By the way, in a modification of the embodiment shown of FIG. 3, it may also be possible to adapt the frequency dividing circuit 4 to be directly controlled by the output of the counter 6 so that its dividing ratio can become 1/(N+n). This will be achieved, for example, by using, for the frequency dividing circuit 4, a counter, into which a preset count value is to be loaded, this counter being counted down by the signal and the frequency divided output being provided whenever the count value of the counter is zero. In such modified arrangement, the preset count value may be changed according to the output of the counter 6 and the pulse generator 8 and AND gate 9 can be omitted.

Figure 5:
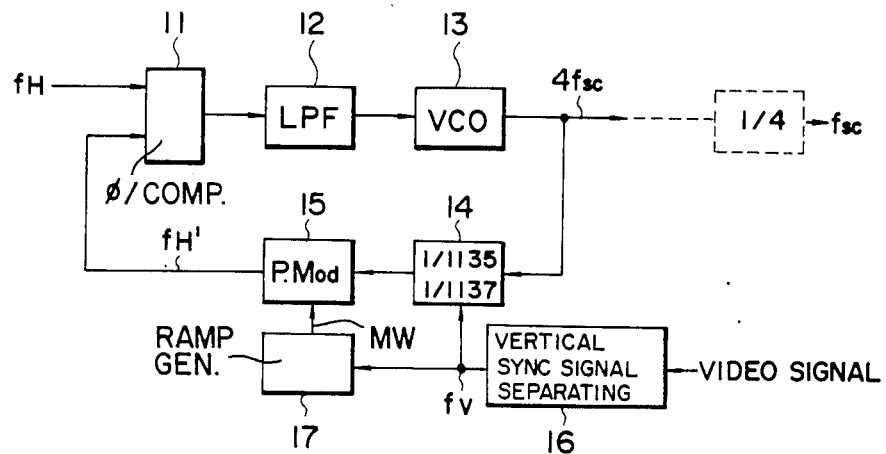
FIG. 5 is a block diagram showing a phase locked loop according to another embodiment of this invention for generating a color subcarrier for the PAL system.

FIG. 5 shows an embodiment of the PLL circuit according to the invention for forming the previously described color subcarrier frequency $f_{sc}$ of the PAL system. Referring to the drawing, 11 denotes a phase comparator, 12 denotes a low-pass filter, 13 denotes a voltage-controlled oscillator, 14 denotes a frequency dividing circuit switchable to either of two dividing ratios of 1135 and 1137, 15 denotes a phase shifter, 16 denotes a vertical synchronizing signal separating circuit, and 17 denotes a shift control or ramp signal generator.

The color subcarrier frequency $f_{sc}$ of the PAL systems is, as described previously, defined by $$4f_{sc} = 1135f_H + 2f_V.$$

From the above equation is derived $$(4/1135)f_{sc} = f_H + (2/1135)f_V,$$

which means that $(4/1135)f_{sc}$ has a frequency difference ($\Delta f$) of $(2/1135)f_V$ with reference to the horizontal scanning frequency $f_H$.

This accounts for $(2/1135)\cdot 2\pi$ of phase difference for one field, namely, it corresponds to 2-clock phase difference of the $4 f_{sc}$ clock signal.

Therefore, the output fH' of phase modulator 15 can be synchronized with the input fH by causing the frequency dividing circuit 14 to ignore the clock signal of N=2 clocks duration for each field in the manner as described above and by resetting the shift control signal generator 17 at the interval of one field corresponding to the above described m-clock period.

Figure 6:
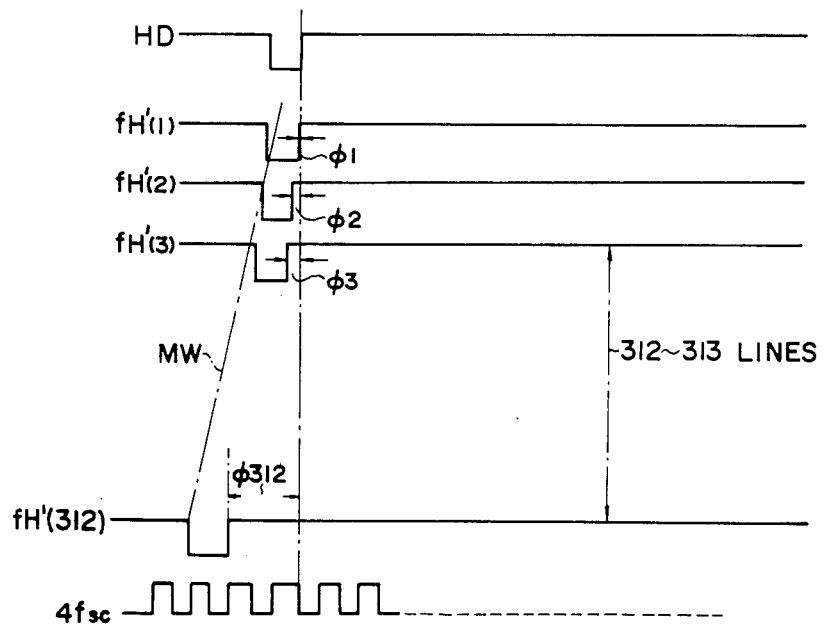
FIG. 6 is a waveform chart for describing operation of the phase-locked loop of FIG. 5.

FIG. 6 indicates phase shift amounts in the signal fH' output from the phase shifter 15 for each horizontal synchronizing signal H, wherein fH'(312), or the maximum phase shift amount to be provided at the end of one field, is indicated by $\phi_{312}$.

The maximum phase shift time duration is $2/(4f_{sc}) \approx 113$ μs, which corresponds to 2 clocks of the color subcarrier $4 f_{sc}$.

Figure 7:
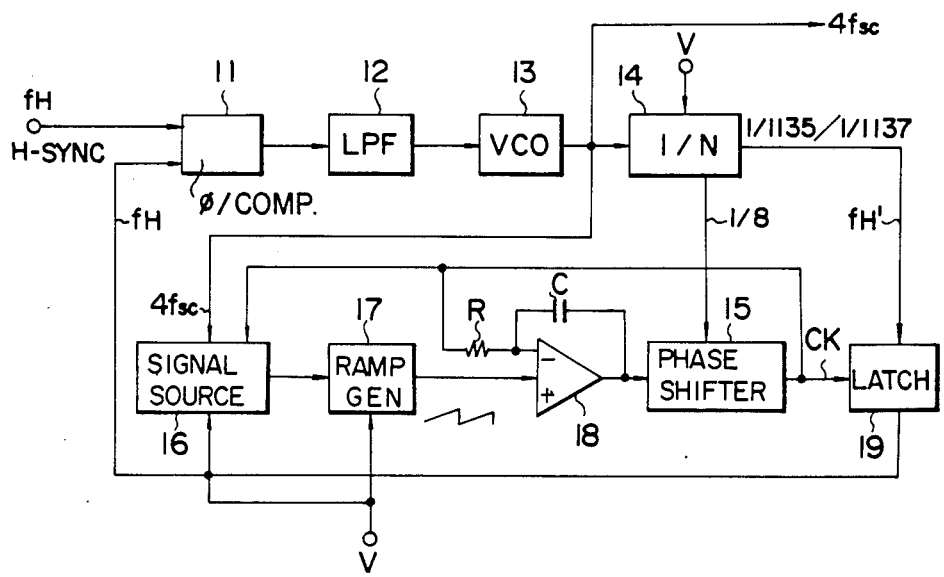
FIG. 7 is a block diagram showing another embodiment of the invention with a preferred phase modulating circuit.

FIG. 7 is a block diagram showing a phase-locked loop according to another embodiment of the invention which is suitable for outputting color subcarrier of the PAL system. In FIG. 7, as in FIG. 5, 11 denotes a phase comparator, 12 denotes a low-pass filter, 13 denotes a voltage-controlled oscillator, 14 denotes a frequency dividing circuit whose dividing ratios are switchable either to 1/1135 or to 1/1137, and 15 denotes a phase shifter.

Reference numeral 16 denotes a current or voltage signal source capable of providing the maximum phase shift amount ($\phi$) at the point in time when the vertical synchronizing signal V is obtained as described above and its output value is adapted to be supplied to a sawtooth wave or ramp generator 17. Reference numeral 18 denotes an integrating circuit for integrating the difference between the signals supplied thereto and 19 denotes a latch circuit.

In this embodiment, as in the example described with reference to FIG. 5, the dividing ratio of the frequency dividing circuit 14 is changed from 1135 to 1137, corresponding to the 2-clock duration, in response to the vertical synchronizing signal V for each field and, further, the sawtooth wave generator 17 for determining the amount of the phase shift by phase shifter 15 is reset at the same time.

With reference to the ramp angle of the sawtooth wave determining the phase shift amount, the maximum phase shift amount at the time of the vertical synchronizing signal V is compensated by the signal source 16 through comparison of the output of the phase shifter 15 with the output of the voltage-controlled oscillator 13. Therefore changes in the phase shift amount due to temperature variations can be eliminated.

Further, in the embodiment of FIG. 7, the phase shifter 15 is supplied with a clock of substantially higher frequency than $(4/1135) f_{sc}$, for example, a clock frequency of $(\frac{8}{8}) f_{sc}$, and phase shifting is achieved by using the output of phase shifter 15 to cause the latch circuit 19 to latch the output of the frequency dividing circuit 14.

Therefore, the shift amount of the phase shifter 15 and the duty of the clock period become high and the gain of the loop including the integrating circuit 18 is also high, and thus, the linearity of the phase shift amount is improved.

Now, operations of the phase modulator as indicated in FIG. 7 and the reason why linearity of the phase shift amount is improved by the use of this phase modulator will be described with reference FIGS. 8 and 9.

Figure 8:
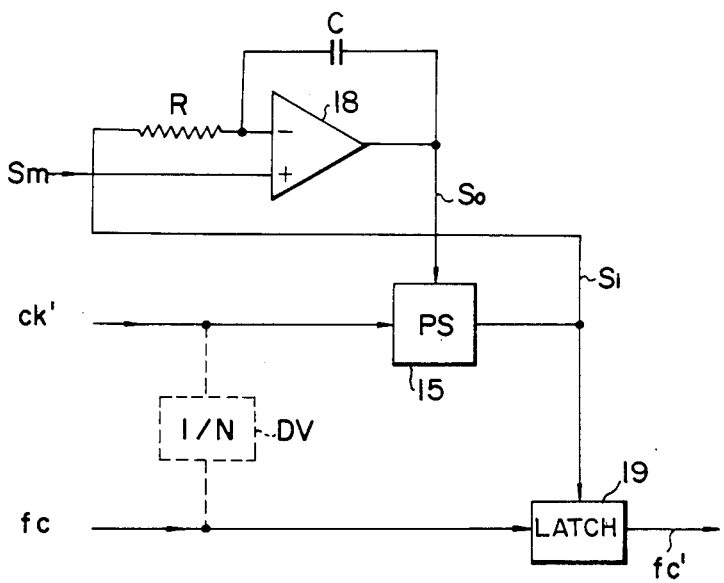
FIG. 8 is a block diagram showing in greater detail the phase modulator included in the circuit of FIG. 7.

FIG. 8 is a block diagram showing the phase modulator extracted from FIG. 7, and wherein the comparator 18 is supplied, at one input terminal with a shift control wave $S_m$ and, at the other input terminal thereof and with a modulated signal $S_i$ which has been phase shifted, and the difference signal from the comparator 18 is output as a signal integrated by resistor R and capacitor C.

The modulated signal $S_i$ is obtained from the phase shifter 15 which may be formed of a monostable multivibrator, a variable delay circuit, etc. and the modulated signal $S_i$ is also applied as a latching signal to latch circuit 19.

Operations of the phase modulator shown in FIG. 8 will be described below with reference to the waveform chart of FIG. 9.

The phase shifter 15 is supplied with a sub signal CK' ($\frac{8}{8}f_{sc}$ in the example of FIG. 7) to be modulated and this signal is converted into a modulated signal $S_i$ whose pulse widths vary in accordance with the levels of the control signal $S_o$ output from the comparator 18.

Figure 9:
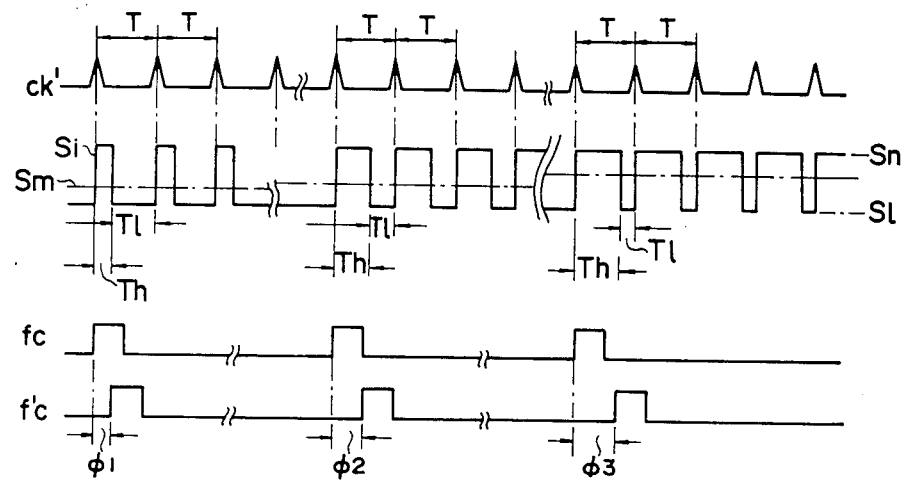
FIG. 9 is a waveform chart to which reference will be made in explaining the operation of the phase modulator of FIG. 8.

Assuming now that "H" or high level periods $T_h$ and "L" or low level periods $T_l$ of the modulated signal $S_i$ vary according to the levels of the shift control wave $S_m$ as indicated in the waveform chart of FIG. 9, the control signal $S_o$ from the comparator 18 will be expressed by $$S_o = 1/(RC) \int_0^{nT} (S_i - S_m) dt \qquad (5)$$

where T is the period of the sub signal (clock signal) CK'.

Representing the value of the "H" level by $S_h$ and that of the "L" level by $S_l$, the above equation (5) will become $$S_o = -(n/RC)\{(S_h - S_m)\cdot T_h = (S_l - S_m)\cdot T_l\} \qquad (6)$$

Since $T_l = T - T_h$, equation (6) may be transformed into $$S_o = -(n/RC)\{(S_l - S_m)\cdot T + (S_h - S_l)\cdot T_h\} \qquad (7)$$

If it is assumed here that there is a relationship:

$$T_h = K \cdot S_o \qquad (8)$$

between the control signal $S_o$ and the "H" level pulse period $T_h$ due to the modulation characteristic K of the phase shifter 15, then $$\begin{aligned} T_h &= K \cdot S_o \\ &= -K \cdot (n/RC)\{(S_l - S_m) \cdot T + (S_h - S_l) \cdot T_h\} \end{aligned} \qquad (9)$$

Therefore, $$T_h = \{-K(n/RC)(S_l-S_m)\cdot T\}\{1+K(N/RC)(S_h-S_l)\} \quad (10)$$

Since it is possible to put $N \to \infty$ at a steady state, $$T_h - (S_m - S_l)/(S_h - S_l) \cdot T \quad (11)$$

As will be understood from the above equation (11), if the feedback loop is comprised of the comparator 18, the phase shift amount ($T_h$) is independent of the modulation characteristic K of the phase shifter 15 and good linearity of the phase shift is achieved.

Further, if we remove from equation (11) the relationships between the level values ($S_h$, $S_l$) of the modulated signal $S_i$ and the "H" level pulse width $T_h$ which indicates the phase shift amount, we obtain:

$$dT_h/dS_h = -\{(S_m - S_l)/(S_h - S_l)^2\}\cdot T \quad (12)$$

$$dT_h/dS_l = -\{(S_m - S_h)/(S_h - S_l)^2\}\cdot T \quad (13)$$

from which it will be seen that, even if the level values ($S_h$, $S_l$) of the modulated signal $S_i$ may vary due to the temperature characteristic, for example, the phase shift amount ($T_h$) becomes less variable as the period T of the sub signal or clock to be modulated is reduced.

Therefore, the phase modulator of a phase-locked loop according to a preferred embodiment of the present invention is arranged so that the clock or sub signal CK' to be modulated which is input to the phase shifter 15 will have a higher frequency than the main signal $f_c$ to be modulated and, as a result of the shortened period T, the ratio of the phase shift amount ($T_h$) thereto, that is, the duty factor $T_h/T$, will become larger.

By so doing, the gain of the feedback loop including the comparator 18 becomes larger and the variation in the phase shift amount due to changes in the temperature of the circuit can be suppressed.

The main signal $f_c$ to be modulated is adapted to be latched by the latch circuit 19 according to the modulated signal $S_i$ output from the phase shifter 15 and thereby is provided with the phase shift amounts $\phi_1$, $\phi_2$, $\phi_3$, . . . .

Although the above described embodiments of the invention are arranged so that the phase modulation is effected after the frequency division, a PLL circuit according to the invention may be structured such that the frequency division is effected after the phase modulation. Further, it will also be possible to apply phase modulation to the input frequency $f_r$ serving as the reference signal.

By way of summary, in the phase locked loop embodying the present invention, a phase modulating circuit for linearly changing the phase is adapted to be reset at an interval of the period related to the offset frequency, and the dividing ratio of a frequency dividing circuit is controlled so that the initial phase relationship is provided at the time of the reset. Thus, an output frequency having a small offset frequency with respect to the input frequency can be easily provided.

What is claimed is:

1. In a phase-locked loop for generating an output signal whose phase is locked onto that of a reference signal and the frequency of which is equal to an offset added to an integral multiple of the frequency of the reference signal, said phase-locked loop comprising:
   a variable frequency oscillator for generating said output signal in response to a control signal controlling the frequency of said output signal;
   a frequency divider having a changeable dividing ratio and being supplied with said output signal for frequency dividing the output signal;
   a resettable shift control signal generator for generating a shift control signal;
   a phase modulator supplied with the output of said frequency divider and said shift control signal for shifting the phase of the output of said frequency divider by an amount which is increased with time until said shift control signal generator is reset;
   a phase comparator supplied with the reference signal and the output of said phase modulator and comparing the same for generating, as a result of such comparison, said control signal supplied to said variable frequency oscillator; and
   means for changing the dividing ratio of said frequency divider and resetting said shift control signal generator at intervals determined by said offset.

2. A phase-locked loop according to claim 1, wherein said means for changing includes counter means for counting the cycles of the output signal and generating a carry signal when it counts a predetermined number of cycles of the output signal determined by each of said intervals, a pulse generator supplied with the carry signal for generating a pulse with a width determined by the changed dividing ratio, and gate means supplied with the output signal and said pulse for interrupting the supplying of said output signal to said frequency divider during the width of said pulse.

3. A phase locked loop according to claim 1, wherein said shift control signal is a ramp signal whose level is linearly increased.

4. A phase-locked loop according to claim 1, wherein said reference signal is a horizontal synchronizing signal of a composite color television signal of the PAL system and said output signal has a frequency four times as high as the color subcarrier frequency of the PAL system.

5. A phase-locked loop according to claim 4, wherein said means for changing includes a vertical synchronizing signal separating circuit for separating a vertical synchronizing signal from said composite color television signal of the PAL system, the separated vertical synchronizing signal being supplied to said frequency divider and said shift control signal generator.

6. A phase-locked loop according to claim 1, wherein said phase modulator includes a phase shifter for shifting the phase of a clock signal whose frequency is substantially higher than that of the output of said frequency divider and a latch circuit for latching the output of said frequency divider by the output of said phase shifter.

7. A phase-locked loop according to claim 6, wherein said phase modulator further includes an additional comparator for comparing said shift control signal and the output of said phase shifter and supplying a resulting comparison output to said phase shifter, and a capacitor connected between the output of said additional comparator and the output thereof to be supplied with the output of said phase shifter.

* * * * *